(12) United States Patent
Kitamura et al.

(10) Patent No.: US 7,749,616 B2
(45) Date of Patent: Jul. 6, 2010

(54) ORGANIC ELECTROLUMINESCENT ELEMENT AND DISPLAY DEVICE USING THE SAME

(75) Inventors: Yoshitaka Kitamura, Kanagawa (JP); Kazuki Yamazaki, Kanagawa (JP); Masayuki Mishima, Kanagawa (JP)

(73) Assignee: Fujifilm Corporation, Tokyo (JP)

( * ) Notice: Subject to any disclaimer, the term of this patent is extended or adjusted under 35 U.S.C. 154(b) by 815 days.

(21) Appl. No.: 11/180,709

(22) Filed: Jul. 14, 2005

(65) Prior Publication Data

US 2006/0012292 A1    Jan. 19, 2006

(30) Foreign Application Priority Data

Jul. 15, 2004 (JP) .............................. 2004-208983
Mar. 23, 2005 (JP) .............................. 2005-084945

(51) Int. Cl.
*H01L 51/54* (2006.01)

(52) U.S. Cl. ....................... 428/690; 428/917; 313/504; 313/506

(58) Field of Classification Search ................. 313/504, 313/506; 257/89
See application file for complete search history.

(56) References Cited

U.S. PATENT DOCUMENTS

| | | | |
|---|---|---|---|
| 6,992,437 B2 * | 1/2006 | Lee et al. ................... | 313/504 |
| 7,211,823 B2 * | 5/2007 | Tung et al .................... | 257/40 |
| 2001/0051285 A1 * | 12/2001 | Shi et al. .................... | 428/690 |
| 2002/0034656 A1 * | 3/2002 | Thompson et al. .......... | 428/690 |
| 2002/0146589 A1 * | 10/2002 | Akiyama et al. ............ | 428/690 |
| 2003/0175553 A1 * | 9/2003 | Thompson et al. .......... | 428/690 |
| 2005/0282036 A1 * | 12/2005 | D'Andrade et al. ......... | 428/690 |

FOREIGN PATENT DOCUMENTS

| JP | 2003-68466 A | 3/2003 |
|---|---|---|
| JP | 2003-77674 A | 3/2003 |

* cited by examiner

*Primary Examiner*—Dawn L Garrett
(74) *Attorney, Agent, or Firm*—Birch, Stewart, Kolasch & Birch, LLP

(57) ABSTRACT

The present invention provides an organic electroluminescent element including an anode, a cathode, and a plurality of organic compound layers including at least one organic luminescent layer between the anode and the cathode, in which the organic luminescent layer contains a host material and two or more phosphorescent materials; the organic luminescent layer is adjacent to the organic compound layers at both an anode side and a cathode side thereof; the organic compound layer disposed adjacent to the organic luminescent layer at the anode side thereby has a thickness of 50 nm or less in thickness; and the organic compound layer disposed adjacent to organic luminescent layer at the cathode side thereby contains a compound having an ionization potential of 6.0 eV or less. The present invention also provides a display device using the organic electroluminescent element.

14 Claims, No Drawings

ORGANIC ELECTROLUMINESCENT ELEMENT AND DISPLAY DEVICE USING THE SAME

CROSS-REFERENCE TO RELATED APPLICATION

This application claims priority under 35 USC 119 from Japanese Patent Applications No. 2004-208983 and 2005-84945, the disclosure of which is incorporated by reference herein.

BACKGROUND OF THE INVENTION

1. Field of the Invention

The present invention relates to an organic electroluminescent element and a display device using the same.

2. Description of the Related Art

Organic luminescent elements employing organic materials are expected to be promising in applications such as inexpensive, full-color, wide flat-panel display devices of the solid luminescent type and writing light source arrays, and thus development of the elements has been carried out extensively. An organic luminescent element in general consists of a luminescent layer, and a pair of opposing electrodes between which the luminescent layer is disposed. When an electric field is applied between the two electrodes, electrons are injected from the cathode and holes are injected from the anode. Luminescence is a phenomenon in which energy is emitted in the form of light, when the electrons and the holes are recombined in the luminescent layer, and the electrons return to the valence band from the conductive band.

Conventional organic luminescent elements require high driving voltage and exhibits low luminescence luminance and luminescence efficiency. In recent years, however, various techniques for solving these problems have been reported.

Japanese Patent Publication Laid-Open (JP-A) 2003-68466 discloses that it is possible, by means of a luminescent element having an anode and a cathode formed on a substrate, and an organic luminescent layer disposed between the anode and the cathode, wherein the organic luminescent layer consists of a host material and a dopant incorporated in this host material, and the dopant comprises a light-emitting material and a non-light-emitting compound, to achieve operation at a low voltage and to obtain high luminance, high efficiency and high durability.

However, in the system utilizing BCP (Bathocuproine) described therein, since BCP has a high ionization potential (6.1 eV), satisfactory durability cannot be obtained, and improvement is desired.

JP-A 2003-77674 discloses an electroluminescent element having a luminescent layer which comprises (1) a host material having an electron transport or hole transport property, (2) Compound A exhibiting phosphorescence emission at room temperature, and (3) Compound B exhibiting phosphorescence emission or fluorescence emission at room temperature and having a maximum light emission wavelength longer than a maximum light emission wavelength of Compound A, wherein Compound B is thereby made capable of light emission with a high efficiency. That is, it has been discovered that with respect to Compound B which is a phosphorescent compound not emitting light with high efficiency by itself, or which is a fluorescent compound emitting light in various colors but incapable of ensuring light emission efficiency as high as that of the phosphorescent compound for any of those colors, when Compound A of the above constituent (2) which exhibits phosphorescence emission at room temperature is used in combination with the foregoing Compound B, Compound A plays a role of sensitizer, and the light emission of Compound B is intensified. However, the luminescent element described in the JP-A 2003-77674 requires a high driving voltage.

Accordingly, there is a need for an organic electroluminescent element which exhibits high external quantum efficiency, superior durability, and low driving voltage.

SUMMARY OF THE INVENTION

The present invention has been made in view of the circumstances described above.

One aspect of the invention is to provide an organic electroluminescent element comprising an anode, a cathode, and a plurality of organic compound layers including at least one organic luminescent layer between the anode and the cathode, in which the organic luminescent layer contains a host material and two or more phosphorescent materials; the organic luminescent layer is adjacent to organic compound layers at both an anode side and a cathode side thereof; the organic compound layer disposed adjacent to the organic luminescent layer at the anode side thereof has a thickness of 50 nm or less; and the organic compound layer disposed adjacent to the organic luminescent layer at the cathode side thereof contains a compound having an ionization potential of 6.0 eV or less.

Another aspect of the invention is to provide a display device comprising an array of at least two or more organic electroluminescent elements emitting light of different colors, wherein at least one of the organic electroluminescent elements is the organic electroluminescent element of the invention.

For the organic electroluminescent element, it is desirable to decrease the driving voltage, in view of lowering the power consumption, by making the film thickness small. However, when the film thickness is made small in the hole transport layer, it is expected that the amount of holes near the hole blocking layer would increase. If the amount of holes near the hole blocking layer is increased, it is expected that using a material with high ionization potential as the hole blocking layer would lead to significant deterioration of durability.

This is because, in other words, when the ionization potential of the material contained in the hole blocking layer is high, a larger amount of energy is required for injecting holes, and when a large amount of energy is required for injecting holes, it is expected that the hole blocking layer would be unstable with respect to the holes. It can be anticipated therefrom that durability can be improved by using a material of low ionization potential in the hole blocking layer.

However, the use of a material of low ionization potential is, in contrast, expected to facilitate injection of holes into the molecules of the material, thus making the hole blocking layer contribute to light emission. This leads to a possibility of deteriorating color purity.

Considering the foregoing, the inventors have achieve both durability and color purity in an organic electroluminescent element by including two or more phosphorescent materials into the organic luminescent layer as described above, and also by employing organic compound layers of specific constitutions, thus completing the invention.

DETAILED DESCRIPTION OF THE INVENTION

Organic Electroluminescent Element

Now, the organic electroluminescent element (hereinafter, optionally referred to as "organic EL element," when appropriate) of the present invention will be explained in detail.

The organic electroluminescent element of the invention is an organic electroluminescent element comprising an anode, a cathode, and a plurality of organic compound layers including at least one organic luminescent layer between the anode and the cathode, in which the organic luminescent layer contains a host material and two or more phosphorescent materials; the organic luminescent layer is adjacent to organic compound layers at both an anode side and a cathode side thereof; the organic compound layer disposed adjacent to the organic luminescent layer at the anode side thereof has a thickness of 50 nm or less; and the organic compound layer disposed adjacent to the organic luminescent layer at the cathode side thereof contains a compound having an ionization potential of 6.0 eV or less.

The organic electroluminescent element of the invention can exhibit, by having the above-described constitution, effects including high external quantum efficiency, excellent durability and low driving voltage, all in their most satisfactory ways. Furthermore, combination of two or more appropriate dopants also results in an effect of exhibiting good color purity.

Note that, thickness and film thickness as used herein are defined to be values measured by transmission electron microscopy. Further, ionization potential is defined to be a value measured at room temperature in the air using AC-1 (produced by Riken Keiki Co., Ltd.). The principles of measurement by AC-1 are described in Chihaya Adachi et al., "Yukihakumaku Shigotokansu Data Shu (Collection of Work Function Data for Organic Thin Film)", CMC Inc. (2004).

In the organic electroluminescent element of the invention, the spectrum resulting from electroluminescence is preferably derived from the two or more phosphorescent materials contained in the luminescent layer, and more preferably derived from one of the two or more phosphorescent materials, in view of enhancement of color purity.

Furthermore, according to the invention, derivation of the spectrum is determined as described below.

That is, among the peaks (maximum values) present in the field-excited luminescence spectrum of an organic electroluminescent element, while attention is paid to those peaks having an intensity of $1/10$ or more of the maximum value, including the peak of the maximum value, the wavelength values of the aforementioned peaks are compared with the wavelength values of the peaks in a light-excited luminescence spectrum for a monolayer of each of the compounds constituting the organic EL element, and thereby the spectrum is considered to be derived from the compound with the closest wavelength values.

Next, an explanation will be given regarding the constitution of the organic electroluminescent element of the invention.

The luminescent element of the invention is constituted such that it has a cathode and an anode on a substrate, and has a plurality of organic compound layers, including at least one organic luminescent layer (hereinafter, in some cases simply referred to as "luminescent layer"), disposed between the two electrodes, with organic compound layers being adjacent to both sides of the organic luminescent layer. It may further have organic compound layers between the organic compound layers adjacent to the organic luminescent layer and the electrodes. Due to the nature of the luminescent element, at least one of the anode and the cathode is preferably transparent. Typically, the anode is transparent.

With regard to the lamination form of the organic compound layers according to the invention, preferred is the form in which lamination is carried out in the order of a hole transport layer, a luminescent layer and an electron transport layer from the anode side. Further, a charge-blocking layer or the like may be present between the hole transport layer and the luminescent layer, or between the luminescent layer and the electron transport layer.

In the organic electroluminescent element of the invention, a suitable form of the organic compound layers is such that at least a hole injecting layer, a hole transport layer, a luminescent layer, a hole blocking layer, an electron transport layer and an electron-injecting layer are disposed in this order from the anode side.

Further, when there is a hole blocking layer disposed between the luminescent layer and the electron transport layer, the organic compound layers adjacent to the organic luminescent layer are arranged such that the layer on the anode side is the hole transport layer, and the layer on the cathode side is the hole blocking layer. Also, there may be a hole injecting layer disposed between the anode and the hole transport layer, and there may be an electron-injecting layer disposed between the cathode and the electron transport layer. Furthermore, each layer may be divided into a plurality of secondary layers.

Next, a detailed explanation will be given regarding the elements constituting the organic electroluminescent element of the invention.

Substrate

The substrate used in the invention is preferably a substrate which does not scatter or attenuate the light emitted from the organic compound layer. Specific examples thereof include inorganic materials such as yttria-stabilized zirconia (YSZ), and glass; polyesters such as polyethylene terephthalate, polybutylene phthalate, and polyethylene naphthalate; and organic materials such as polystyrene, polycarbonate, polyethersulfone, polyallylate, polyimide, polycycloolefin, norbornene resins, and poly(chlorotrifluoroethylene).

For example, when glass is used for the substrate, it is preferable to use a non-alkali glass as the substrate material, in order to reduce the ions eluting from the glass. Also, when soda lime glass is used, it is preferable to use one having a barrier coat such as silica or the like. In the case of using organic materials, preferred are those having excellent heat resistance, dimensional stability, solvent resistance, electrical insulating property and processability.

The shape, structure, size and the like of the substrate are not particularly limited and can be selected appropriately in accordance with the intended use, purpose and the like of the luminescent element. In general, the substrate is preferably plate-shaped. The structure of the substrate may be either a monolayer structure or a laminated structure. Further, the substrate may be made of a single material or of two or more materials.

The substrate may be colorless and transparent, or colored and transparent, but in view of not scattering or attenuating the light emitted from the organic luminescent layer, a colorless and transparent substrate is preferred.

The substrate can be provided with a layer preventing moisture permeation (gas barrier layer) on the surface or the inner side.

As for the material for the layer preventing moisture permeation (gas barrier layer), inorganic substances such as silicon nitride, silicon oxide or the like are suitably used. The layer preventing moisture permeation (gas barrier layer) can be formed, for example, by radiofrequency sputtering or the like.

When a thermoplastic substrate is used, a hard coat layer, an undercoat layer or the like may be further provided, if necessary.

Anode

It would be usually sufficient for the anode as long as it has the function as an electrode supplying holes to the organic compound layer. There is no limitation on the shape, structure, size or the like, and the material can be appropriately selected from known electrode materials depending on the intended use and purpose of the luminescent element. As described above, the anode is typically furnished as a transparent anode.

As for the material for the anode, mention may be suitably made of, for example, metals, alloys, metal oxides, electroconductive compounds or mixtures thereof, and preferred is a material having a work function of 4.0 eV or greater. Specific examples of the anode material include electroconductive metal oxides such as tin oxide doped with antimony or fluorine (ATO, FTO), tin oxide, zinc oxide, indium oxide, indium tin oxide (ITO), and zinc indium oxide (IZO); metals such as gold, silver, chromium, and nickel; as well as mixture or laminates of such metals and electroconductive metal oxides; inorganic electroconductive materials such as copper iodide, and copper sulfate; organic electroconductive materials such as polyaniline, polythiophene, and polypyrrole; and laminates of these substances with ITO. Preferred among these is an electroconductive metal oxide, and particularly preferred is ITO in the aspects of productivity, high conductivity and transparency.

The anode can be formed on the above-described substrate according to a method appropriately selected, in consideration of the suitability to the material constituting the anode, for example, from wet methods such as printing and coating, physical methods such as vacuum deposition, sputtering and ion plating, and chemical methods such as CVD and plasma CVD. For example, when ITO is selected as the material for anode, formation of the anode can be carried out by DC sputtering or radiofrequency sputtering, vacuum deposition, ion plating or the like.

In the organic electroluminescent element of the invention, the anode can be formed in any part of the luminescent element selected according to the intended use and purpose thereof, without particular limitation. It is preferred that the anode is formed on the substrate. In this case, the anode may be formed on the entire surface of one side of the substrate, or in a part of such surface.

Moreover, patterning during the formation of an anode may be carried out by means of chemical etching involving photolithography or the like, or by means of physical etching involving laser or the like. Further, it may be also carried out by vacuum deposition or sputtering with repeated masking, or may be carried out by the lift-off method or printing method.

The thickness of the anode can be appropriately selected in accordance with the material constituting the anode and thus cannot be indiscriminately defined. It is usually from 10 nm to 50 μm, and preferably from 50 nm to 20 μm.

The resistance value of the anode is preferably $10^3$ Ω/sq. or less, and more preferably $10^2$ Ω/sq. or less. When the anode is transparent, it may be colorless and transparent, or colored and transparent. In order to obtain luminescence from the transparent anode side, the transmission is preferably 60% or higher, and more preferably 70% or higher.

In addition, a transparent anode is described in detail in "Tohmeidenkyokumaku No Shintenkai (New Development of Transparent Electrode Films)" supervised by Yutaka Sawada, CMC Inc. (1999), the description of which is applicable to the invention. In case of using a plastic base with low heat resistance, it is preferable to employ ITO or IZO and a transparent anode film formed at a low temperature of 150° C. or below.

Cathode

It is usually sufficient for a cathode as long as it has the function as an electrode of injecting electrons to the organic compound layer. There is no limitation on the shape, structure, size or the like, and the material can be appropriately selected from known electrode materials depending on the intended use and purpose of the luminescent element.

As for the material constituting the cathode, mention may be suitably made of, for example, metals, alloys, metal oxides, electroconductive compounds or mixtures thereof, and preferred is a material having a work function of 4.5 eV or less. Specific examples of the cathode material include alkali metals (e.g., Li, Na, K, Cs, etc.), alkaline earth metals (e.g., Mg, Ca, etc.), gold, silver, lead, aluminum, sodium-potassium alloys, lithium-aluminum alloys, magnesium-silver alloys, rare earth metals such as indium, and ytterbium. They may be used individually, or from the viewpoint of achieving both stability and the electron injection property, they may be suitably used in combination of two or more species.

Among these, as for the material constituting the cathode, alkali metals or alkaline earth metals are preferred from the viewpoint of the electron injection property, and materials mainly comprising aluminum are preferred in the viewpoint of excellent storage stability.

The materials mainly comprising aluminum include aluminum itself, and alloys or mixtures comprising aluminum and 0.01 to 10% by mass of alkali metals or alkaline earth metals (e.g., lithium-aluminum alloys, magnesium-aluminum alloys, etc.).

In addition, the materials for the cathode are described in detail in the publications of JP-A 2-15595 and JP-A 5-121172, the descriptions of which are applicable to the invention.

The method for formation of a cathode is not particularly limited and may be carried out according to a known method. The cathode can be formed according to a method appropriately selected, in consideration of the suitability to the aforementioned material constituting the cathode, for example, from wet methods such as printing and coating, physical methods such as vacuum deposition, sputtering and ion plating, and chemical methods such as CVD and plasma CVD. For example, in the case of selecting a metal or the like as the material for the cathode, the formation can be carried out by simultaneous or successive sputtering of one, or two or more species.

Patterning during the formation of the cathode may be carried out by means of chemical etching involving photolithography or the like, or by means of physical etching involving laser or the like. Further, it may be also carried out by vacuum deposition or sputtering with repeated masking, or may be carried out by the lift-off method or printing method.

In the invention, there is no particular limitation on the location of the cathode formed, and the cathode may be formed all over the organic compound layer, or in a part thereof.

Further, a dielectric layer of 0.1 to 5 nm in thickness, comprising a fluoride, oxide or the like of an alkali metal or an alkaline earth metal may be inserted in between the cathode and the aforementioned organic compound layer. This dielectric layer can be viewed as a type of electron-injecting layer. The dielectric layer can be formed by, for example, vacuum deposition, sputtering, ion plating or the like.

The thickness of the cathode can be appropriately selected in accordance with the material constituting the cathode and thus cannot be indiscriminately defined. It is usually from 10 nm to 5 μm, and preferably from 50 nm to 1 μm. Also, the cathode may be transparent or opaque. In addition, a transparent cathode can be formed by forming a film of a cathode material having a thickness of 1 to 10 nm and further laminating thereon a transparent electroconductive material such as ITO or IZO.

Organic Compound Layer

The organic compound layer according to the invention will be explained.

The organic electroluminescent element of the invention has a plurality of organic compound layers including at least one luminescent layer, and the organic compound layers other than the organic luminescent layer include, as described above, the hole transport layer, the electron transport layer, the charge-blocking layer, the hole injecting layer, the electron-injecting layer or the like.

The luminescent layer according to the invention is constituted such that it is adjacent to organic compound layers at both the anode side and the cathode side thereof.

The organic compound layer disposed adjacent to the luminescent layer at the anode side thereof is necessarily a layer having a thickness of 50 nm or less, preferably of 5 nm or greater and 50 nm or less, and more preferably of 10 nm or greater and 40 nm or less, from the viewpoint of lowering the driving voltage.

The layer disposed adjacent to the luminescent layer at the anode side thereof may be exemplified by the hole injecting layer and the hole transport layer, while the hole transport layer is preferred. These layers will be described later in detail.

Furthermore, the organic compound layer disposed adjacent to the luminescent layer at the cathode side thereof is necessarily a layer which contains a compound having an ionization potential of 6.0 eV or less, and preferably a layer which contains a compound having an ionization potential of from 5.6 to 6.0 eV, from the viewpoint of improving durability.

The layer adjacent to the luminescent layer at the cathode side thereof may be exemplified by the hole blocking layer, and the electron transport layer, while the hole blocking layer is preferred. These layers will be described later in detail.

Formation of Organic Compound Layer

In the organic electroluminescent element of the invention, each of the layers constituting the organic compound layer can be suitably formed by any dry film forming method such as vapor deposition or sputtering, transcription method, printing method and the like.

Organic Luminescent Layer

The organic luminescent layer is a layer having the function of emitting light by accepting holes from the anode, the hole injecting layer or the hole transport layer and accepting electrons from the cathode, the electron-injecting layer or the electron transport layer upon application of an electric field, and providing a site for recombination of the holes and the electrons.

The luminescent layer according to the invention contains a host material and dopants comprising two or more phosphorescent materials. The host material is preferably a charge-transporting material.

Further, the luminescent layer may consist of a single layer or two or more layers, and each of the layers may emit light in different colors. Even in the case of having a plurality of the luminescent layer, each layer constituting the luminescent layer contains a host material and dopants comprising two or more phosphorescent materials.

The phosphorescent material contained in the luminescent layer is in general a complex including a transition metal atom or a lanthanoid atom.

The transition metal atom is not particularly limited but may be preferably exemplified by ruthenium, rhodium, palladium, tungsten, rhenium, osmium, iridium and platinum, and more preferably by rhenium, iridium and platinum.

The lanthanoid atom may be exemplified by lanthanum, cerium, praseodymium, neodymium, samarium, europium, gadolinium, terbium, dysprosium, holmium, erbium, thulium, ytterbium and lutetium. Among these lanthanoid atoms, neodymium, europium and gadolinium are preferred.

As for the ligand of the complex, mention may be made of, for example, the ligands described in G. Wilkinson et al, Comprehensive Coordination Chemistry, Pergamon Press (1987); H. Yersin, "Photochemistry and Photophysics of Coordination Compounds," Springer-Verlag (1987); and Akio Yamamoto, "Yukikinzokukagaku—Kiso to Oyo (Organic Metal Chemistry—Fundamentals and Applications)," Shokabo (1982) or the like.

Specific examples of the ligand include preferably halogen ligands (preferably chlorine ligands), nitrogen-containing heterocyclic ligands (e.g., phenyl pyridine, benzoquinoline, quinolinol, bipyridyl, phenanthroline, etc.), diketone ligands (e.g., acetylacetone, etc.), carboxylic acid ligands (e.g., acetic acid ligands, etc.), carbon monoxide ligands, isonitrile ligands, and cyano ligands, and more preferably nitrogen-containing heterocyclic ligands. The complex may have one transition metal atom, and may be also a so-called multi-nuclear complex having two or more of such atoms. It may also contain metal atoms of different species simultaneously.

The luminescent layer according to the invention is required to contain phosphorescent materials of two or more kinds as dopants in view of improving the color purity. These phosphorescent materials of two or more kinds are preferably metal complexes of two or more kinds. Moreover, the metal complexes of two or more kinds are preferably metal complexes having different central metal atoms, respectively. In addition, from the viewpoint of preparation of elements, the dopants consisting of the phosphorescent materials contained in the luminescent layer are particularly preferably of only two kinds.

The phosphorescent materials are contained in the luminescent layer each in an amount of preferably from 0.1 to 20% by mass, and more preferably from 0.5 to 10% by mass.

Furthermore, the content ratio of the two or more kinds of dopants contained in the luminescent layer is not particularly limited, but the ratio of (the dopant from which the luminescence spectrum is derived)/(dopants other than that) is preferably between 100/1 and 1/10, and more preferably between 20/1 and 1/5, and even more preferably between 5/1 and 1/2.

The host material contained in the luminescent layer according to the invention may be exemplified by the compounds having the carbazole skeleton, the compounds having the diarylamine skeleton, the compounds having the pyridine skeleton, the compounds having the pyrazine skeleton, the compounds having the triazine skeleton and the compounds having the arylsilane skeleton.

T1 level (the energy level of the lowest excited multiplet state) of the host material is preferably greater than the T1 level of the dopant materials. Moreover, by co-depositing the host material and the dopant materials, a luminescent layer in which the dopant materials are doped in the host material can be appropriately formed.

The thickness of the luminescent layer is not particularly limited, but usually it is preferably from 1 nm to 500 nm, more preferably from 5 nm to 200 nm, and even more preferably from 10 nm to 100 nm.

Hole Injecting Layer and Hole Transport Layer

The hole injecting layer and the hole transport layer are layers having the function of accepting holes from the anode or the anode side and transporting them to the cathode side. Specifically, the hole injecting layer and the hole transport layer are preferably layers containing carbazole derivatives, triazole derivatives, oxazole derivatives, oxadiazole derivatives, imidazole derivatives, polyarylalkane derivatives, pyrazoline derivatives, pyrazolone derivatives, phenylenediamine derivatives, arylamine derivatives, amino-substituted chalcone derivatives, styrylanthracene derivatives, fluorenone derivatives, hydrazone derivatives, stilbene derivatives, silazane derivatives, aromatic tertiary amine compounds, styrylamine compounds, aromatic dimethylidene-based compounds, porphyrin-based compounds, organic silane derivatives, carbon or the like. The thickness of the hole injecting layer and the hole transport layer are each preferably 50 nm or less, from the viewpoint of lowering the driving voltage. When the hole transport layer is the layer disposed adjacent to the luminescent layer, it is essential that the thickness of the layer is 50 nm or less.

The thickness of the hole transport layer is preferably from 5 to 50 nm, and more preferably from 10 to 40 nm. Also, the thickness of the hole injecting layer is preferably from 0.5 to 50 nm, and more preferably from 1 to 40 nm.

The hole injecting layer and the hole transport layer may be of single-layered structure comprising one, or two or more species of the aforementioned materials, or may be of a multilayered structure consisting of a plurality of layers having the same composition or different compositions.

Electron-Injecting Layer and Electron Transport Layer

The electron-injecting layer and the electron transport layer are layers having the function of accepting electrons from the cathode or the cathode side and transporting them to the anode side. Specifically, the electron-injecting layer and the electron transport layer are preferably layers containing triazole derivatives, oxazole derivatives, oxadiazole derivatives, imidazole derivatives, fluorenone derivatives, anthraquinodimethane derivatives, anthrone derivatives, diphenylquinone derivatives, thiopyran dioxide derivatives, carbodiimide derivatives, fluorenylidenemethane derivatives, distyrylpyrazine derivatives, aromatic tetracarboxylic acid anhydrides such as naphthalene and perylene, phthalocyanine derivatives, various metal complexes represented by metal complexes of 8-quinolinol derivatives, metallophthalocyanines, and metal complexes having benzoxazole or benzothiazole as the ligand, oganic silane derivatives or the like.

The thickness of the electron-injecting layer and the electron transport layer is each preferably 50 nm or less in viewpoint of lowering the driving voltage.

The thickness of the electron transport layer is preferably from 5 to 50 nm, and more preferably from 10 to 50 nm. Also, the thickness of the electron-injecting layer is preferably from 0.1 to 50 nm, and more preferably from 0.5 to 20 nm.

The electron-injecting layer and the electron transport layer may be of a single-layered structure comprising one or two or more species of the aforementioned materials, or may be of a multilayered structure consisting of a plurality of layers having the same composition or different compositions.

When the electron transport layer is the layer disposed adjacent to the luminescent layer, a material having an ionization potential of 6.0 eV or less is used as the material constituting the corresponding layer, from the viewpoint of improving durability.

Hole Blocking Layer

The hole blocking layer is a layer having the function of preventing the holes transported from the anode side to the luminescent layer from escaping through the cathode side. According to the invention, it is desirable to provide a hole blocking layer as the organic compound layer disposed adjacent to the luminescent layer from the cathode side.

Specifically, the hole blocking layer is preferably a layer containing aluminum complexes such as BAlq, triazole derivatives, pyrazabole derivatives or the like.

When the hole blocking layer is provided as the organic compound layer disposed adjacent to the luminescent layer, a material having an ionization potential of 6.0 eV or less is used as the material constituting the corresponding layer, from the aspect of improving durability.

Further, the thickness of the hole blocking layer is preferably 50 nm or less, more preferably from 1 to 50 nm, and even more preferably from 5 to 40 nm, in view of lowering the driving voltage.

Protective Layer

According to the invention, the organic EL element as a whole may be protected by a protective layer.

The materials contained in the protective layer would be desirable to have the function of inhibiting the factors which promote element deterioration such as moisture or oxygen entering into the element.

Specific examples thereof include metals such as In, Sn, Pb, Au, Cu, Ag, Al, Ti, Ni or the like; metal oxides such as MgO, SiO, $SiO_2$, $Al_2O_3$, GeO, NiO, CaO, BaO, $Fe_2O_3$, $Y_2O_3$, $TiO_2$ or the like; metal nitrides such as $SiN_x$, and $SiN_xO_y$; metal fluorides such as $MgF_2$, LiF, $AlF_3$, and $CaF_2$; polyethylene, polypropylene, polymethyl methacrylate, polyimide, polyurea, polytetrafluoroethylene, polychlorotrifluoroethylene, polydichlorodifluoroethylene, copolymers of chlorotrifluoroethylene and dichlorodifluoroethylene, copolymers obtainable by copolymerization of a monomer mixture including tetrafluoroethylene and at least one comonomer, fluorine-containing copolymers having a cyclic structure in the copolymer main chain, absorbent materials having an absorption rate of 1% or more, and moisture-resistant materials having an absorption rate of 0.1% or less.

The method for formation of the protective layer is not particularly limited, and for example, vacuum deposition method, sputtering, reactive sputtering method, MBE method (molecular beam epitaxy), cluster ion beam method, ion plating method, plasma polymerization method (radiofrequency-excited ion plating), plasma CVD method, laser CVD method, thermal CVD method, gas source CVD method, coating method, printing method, and transcription method.

Sealing

Moreover, the organic electroluminescent element of the invention may be sealed for the entire element using a sealing vessel.

Also, the space between the sealing vessel and the luminescent element may be sealed with a moisture absorbent or an inactive liquid. The moisture absorbent, though not particularly limited, may be exemplified by barium oxide, sodium oxide, potassium oxide, calcium oxide, sodium sulfate, calcium sulfate, magnesium sulfate, phosphorous pentoxide, calcium chloride, magnesium chloride, copper chloride, cesium fluoride, niobium fluoride, calcium bromide, vanadium bromide, molecular sieves, zeolites, magnesium oxide or the like. The inactive liquid, though not particularly limited, may be exemplified by paraffins, liquid paraffins, fluorine-based solvents such as perfluoroalkanes, perfluoroamines or perfluoroethers, chlorine-based solvents, and silicone oils.

In the organic electroluminescent element of the invention, light emission can be achieved by applying a direct current (it may include an alternating current component, if desired) voltage (typically 2 volts to 15 volts) or a DC current between the anode and the cathode.

As for the method of driving the organic electroluminescent element of the invention, the methods described in the publications of JP-A Nos. 2-148687, 6-301355, 5-29080, 7-134558, 8-234685 and 8-241047, in the specifications of Japanese Patent No. 2784615, U.S. Pat. Nos. 5,828,429 and 6,023,308, and the like can be applied.

Display Device

The display device of the invention will be explained.

The display device of the invention is a display device comprising an array of at least two kinds of organic electroluminescent elements emitting light of different colors, and is characterized in that at least one of the foregoing organic electroluminescent elements is the organic electroluminescent element of the invention.

In a display device in which at least two kinds of organic electroluminescent elements emitting light of different colors are arranged in a matrix form, there are cases where at least one kind of the luminescent elements constituting the display device has higher driving voltage compared with other luminescent elements, and the driving voltages of the luminescent elements constituting the display device may not be uniform. In such cases, when at least one kind of the luminescent elements constituting the display device is displaced by the organic electroluminescent element of the invention, lowering of the voltage becomes possible, and the driving voltages of the luminescent elements constituting the display device can be mode uniform. Accordingly, there can be obtained advantages such as simplification of the design of the operating circuit or the like. In particular, for a display device in which organic electroluminescent elements emitting light in red, green and blue colors are arranged in a matrix form, it is very advantageous to use the organic electroluminescent element of the invention as an organic electroluminescent element for red color.

EXAMPLES

Hereinafter, the invention will be specifically explained by way of Examples, which are not intended to limit the invention.

Example 1

On a glass substrate having a transparent conductive film of indium•tin oxide (ITO) deposited thereon to a thickness of 150 nm (manufactured by Geomatech), an anode was formed by performing patterning via photolithography and hydrochloric acid etching. The pattern-formed ITO substrate was subjected to ultrasonic cleaning in acetone, washing with pure water and ultrasonic cleaning in isopropyl alcohol in the described order, then to drying by nitrogen blowing and finally to ultraviolet ozone cleaning. The thus treated substrate was placed in a vacuum deposition apparatus. Subsequently, a vacuum was drawn until the degree of vacuum in the deposition apparatus was lowered to $2.7 \times 10^{-4}$ Pa or less.

Subsequently, copper phthalocyanine (CuPc) represented below was heated in the deposition apparatus, and deposition was carried out at a deposition rate of 0.1 nm/sec, to form a hole injecting layer having a thickness of 10 nm.

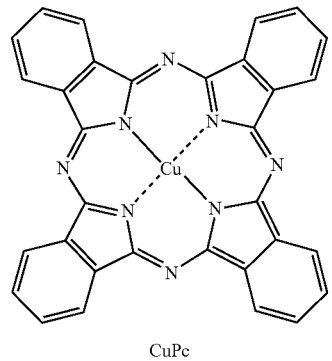

CuPc

Next, on the thus formed hole injecting layer, deposition was carried out at a deposition rate of 0.2 nm/sec by heating 4,4'-bis[N-(1-naphthyl)-N-phenylamino]biphenyl (α-NPD) represented below with a heater, to form a hole transport layer having a thickness of 40 nm.

α - NPD

Subsequently, on the thus formed hole transport layer, a luminescent layer was formed by means of triple simultaneous deposition (codeposition from three crucibles) by heating 4,4'-N,N'-dicarbazolebiphenyl (CBP) represented below as the host material contained in the luminescent layer, and tris(2-phenylpyridine) iridium (dopant A) represented below and the platinum complex (dopant B) represented below as the phosphorescent organic metal complexes of the dopant material. A luminescent layer containing 5% by mass of the dopant A and 5% by mass of the dopant B was laminated on the hole transport layer to a thickness of 30 nm, with the deposition rate for CBP being controlled to be 0.2 nm/sec.

CBP

-continued

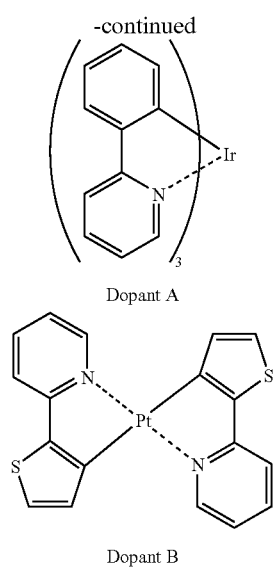

Dopant A

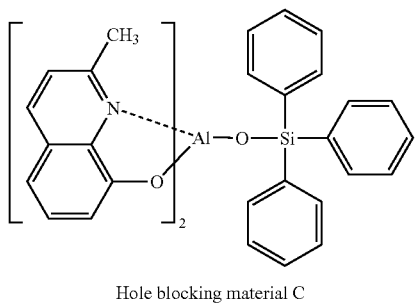

Dopant B

Furthermore, the compound represented below (hole blocking material C) was deposited at a deposition rate of 0.1 nm/sec, and a hole blocking layer was laminated on the luminescent layer to a thickness of 10 nm.

The ionization potential of the hole blocking material C was 5.8 as measured with AC-1 (Produced by Riken Keiki Co., Ltd.).

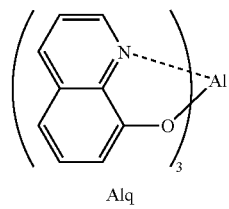

Hole blocking material C

Subsequently, tris(8-hydroxyquinolinate) aluminum (Alq) represented below was deposited at a deposition rate of 0.2 nm/sec on the hole blocking layer, to form an electron transport layer having a thickness of 35 nm.

Alq

Next, a film of lithium fluoride (LiF) was formed on the electron transport layer to a thickness of 1.5 nm at a deposition rate of 0.1 nm/sec, to form an electron-injecting layer, and further a cathode made of aluminum was formed thereon to a thickness of 100 nm at a deposition rate of 0.5 nm/sec.

Further, the anode and the cathode were connected to aluminum lead wires, respectively.

The thus obtained element was placed in a glove box purged with nitrogen gas, without being exposed to the air.

In a sealing cover made of stainless steel having a recess provided in the inner part, 10 mg of calcium oxide powder as a moisture absorbent for the inside of the glove box was placed and fixed with adhesive tape. Sealing was completed using the sealing cover and a UV-curable adhesive (XNR5516HV, manufactured by Nagase Ciba) as the adhesive.

In this manner, and an organic EL element of Example 1 was obtained.

Note that, the during deposition, a quartz-oscillating type film-forming controller (manufactured by ULVAC, CRTM6000) was used for monitoring so as to obtain the desired thicknesses.

To the organic EL element that was obtained in the above, a DC voltage was applied using a Source Measure Unit 2400 manufactured by Keithley, and the luminance was measured using a BM-8 manufactured by Topcon.

Also, a multichannel analyzer PMA-11 manufactured by Hamamatsu Photonics was used to measure the spectral waveform.

From the results of these measurements, the values of the driving voltage, the external quantum efficiency and the luminescence wavelength peak at 200 cd/m$^2$ were obtained.

Furthermore, the maximum wavelength of the luminescence spectrum of the element that was obtained from Example 1 was 584 nm, which was identified to be derived from the dopant B.

Moreover, by operating with a constant current at an initial luminance of 200 cd/m$^2$, the time required for the luminance to reach 100 cd/m$^2$ was measured and taken as an index for durability (referred to as the half-time in Table 1).

Example 2

An organic EL element was prepared in the same manner as in Example 1, except that the thickness of the hole transport layer as formed in Example 1 was changed to 25 nm, and the same measurements were carried out as in Example 1.

The maximum wavelength of the luminescence spectrum of the element that was obtained according to Example 2 was 583 nm, which was identified to be derived from the dopant B.

Example 3

An organic EL element was prepared in the same manner as in Example 1, except that the thickness of the hole transport layer as formed in Example 1 was changed to 10 nm, and the same measurements were carried out as in Example 1. The maximum wavelength of the luminescence spectrum of the element that was obtained according to Example 3 was 584 nm, which was identified to be derived from the dopant B.

Comparative Example 1

An organic EL element was prepared in the same manner as in Example 1, except that the thickness of the hole transport layer as formed in Example 1 was changed to 60 nm, and the same measurements were carried out as in Example 1.

Comparative Example 2

An organic EL element was prepared in the same manner as in Example 1, except that only the dopant B was used as the dopant contained in the luminescent layer of Example 1, and the same measurements were carried out as in Example 1.

The measurement results of Examples 1 to 3 and Comparative Examples 1 and 2 are shown in the following Table 1.

TABLE 1

|  | Dopant contained in luminescent layer | Thickness of hole transport layer (nm) | Driving voltage (V) | External quantum efficiency (%) | Peak wavelength (nm) | Half-time (Hour) |
| --- | --- | --- | --- | --- | --- | --- |
| Example 1 | A, B | 40 | 8 | 5.2 | 584 | 2500 |
| Example 2 | A, B | 25 | 7 | 5.3 | 583 | 3000 |
| Example 3 | A, B | 10 | 6 | 5.0 | 584 | 2700 |
| Comparative Example 1 | A, B | 60 | 10 | 4.5 | 584 | 1600 |
| Comparative Example 2 | B | 40 | 8 | 1.8 | 584, 490 | 500 |

As shown in Table 1, the elements of Examples 1 to 3 were found to be elements having high external quantum efficiencies, excellent durability, and low driving voltages.

On the other hand, when Examples 1 to 3 were compared with Comparative Example 1, it was found that as the hole transport layer (the layer disposed adjacent to the luminescent layer at the anode side thereof) became thicker, a higher driving voltage was required.

Further, it was found that in the element of Comparative Example 2 which contains only the dopant B in the luminescent layer, the presence of two luminescence peaks resulted in poor color purity, while in an element having the luminescent layer doped with two or more dopants as in the element of Example 1, the luminescence peak became one, resulting in improvement in color purity as well as high luminescence intensity.

Example 4

On a glass substrate having a transparent conductive film of indium (tin oxide (ITO) deposited to 150 nm, as used in Example 1, formation of the anode and cleaning were carried out in the same manner as in Example 1, and the whole assembly was placed in a vacuum deposition apparatus. Then, a vacuum was drawn until the degree of vacuum in the deposition apparatus was lowered to $2.7 \times 10^{-4}$ Pa or less.

Subsequently, in the aforementioned deposition apparatus, a hole injecting layer was formed by depositing CuPc to a thickness of 10 nm at a deposition rate of 0.1 nm/sec.

Next, on the hole injecting layer, a hole transport layer was formed by depositing α-NPD to a thickness of 40 nm at a deposition rate of 0.2 nm/sec.

Subsequently, a luminescent layer was formed by triple simultaneous deposition (codeposition from three crucibles) using CBP, the dopant A and the dopant B as the host material and dopants contained in the luminescent layer, as in Example 1. A luminescent layer containing 5% by mass of the dopant A and 5% by mass of the dopant B was laminated on the hole transport layer to a thickness of 40 nm, with the deposition rate for CBP being controlled to be 0.2 nm/sec.

Further, a hole blocking layer was laminated on the luminescent layer to a thickness of 10 nm by depositing BAlq, as represented below, at a deposition rate of 0.1 nm/sec.

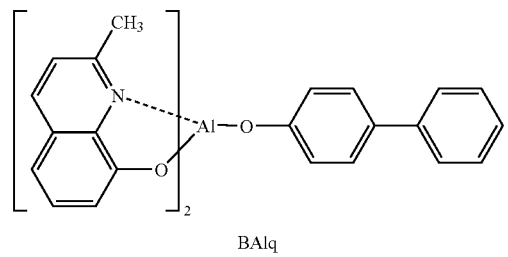

BAlq

Further subsequently, an electron transport layer was formed on the hole blocking layer to a thickness of 35 nm by depositing Alq at a deposition rate of 0.2 nm/sec.

Thereafter, an electron-injecting layer was formed on the electron transport layer by forming a film of lithium fluoride ($LiF_2$) to a thickness of 1.5 nm at a deposition rate of 0.1 nm/sec, and the cathode made of aluminum was formed thereon to a thickness of 100 nm at a deposition rate of 0.5 nm/sec. Further, the anode and the cathode were connected to aluminum lead wires.

The thus obtained element was placed in a glove box purged with nitrogen gas, without being exposed to the air.

In a sealing cover made of stainless steel having a recess provided in the inner part, 10 mg of calcium oxide powder as a moisture absorbent for the inside of the glove box was placed and fixed with adhesive tape. Sealing was completed using the sealing cover and a UV-curable adhesive (XNR5516HV, manufactured by Nagase Ciba) as the adhesive.

In this manner, an organic EL element of Example 4 was obtained.

To the organic EL element that was obtained in the above, a DC voltage was applied using a Source Measure Unit 2400 manufactured by Keithley, and the luminance was measured using a BM-8 manufactured by Topcon.

Also, a multichannel analyzer PMA-11 manufactured by Hamamatsu Photonics was used to measure the spectral waveform. From the results of these measurements, the values of the driving voltage, the external quantum efficiency and the luminescence wavelength peak at 200 cd/m² were obtained. Furthermore, the maximum wavelength of the luminescence spectrum of the element that was obtained according to Example 4 was 584 nm, which was identified to be derived from the dopant B.

Moreover, by operating with a constant current at an initial luminance of 200 cd/m², the time required for the luminance to reach 100 cd/m² was measured and taken as an index for durability (referred to as the half-time in Table 2).

The ionization potential of BAlq used in the hole blocking layer of this element was 5.9 eV as measured with AC-1 (manufactured by Riken Keiki Co., Ltd.).

Comparative Example 3

An organic EL element was prepared in the same manner as in Example 4, except that the compound (BCP) represented below was used in place of BAlq in the hole blocking layer as formed in Example 4, and the same measurements were carried out as in Example 4.

The ionization potential of BCP used in the hole blocking layer of the element of Comparative Example 3 was measured with AC-1 (Riken Keiki Co., Ltd.) to be 6.1 eV.

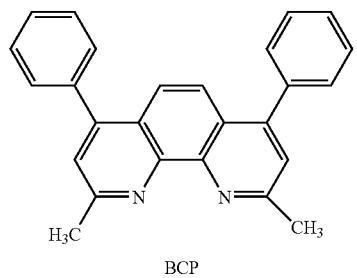

BCP

Comparative Example 4

An organic EL element was prepared in the same manner as in Example 4, except that only the dopant B was used as the dopant contained in the luminescent layer of Example 4, and the same measurements were carried out as in Example 4.

The measurement results of Example 4, Comparative Examples 3 and 4 are shown in the following Table 2.

TABLE 2

| | Dopant contained in luminescent layer | Hole blocking layer | Driving voltage (V) | External quantum efficiency (%) | Peak wavelength (nm) | Half-time (Hour) |
|---|---|---|---|---|---|---|
| Example 4 | A, B | BAlq | 8 | 5.4 | 584 | 3200 |
| Comparative Example 3 | A, B | BCP | 10 | 4.5 | 584 | 1400 |
| Comparative Example 4 | B | BAlq | 8 | 2.3 | 583, 495 | 650 |

As shown in Table 2, the element of Example 4 was found to be element having high external quantum efficiency, excellent durability, and a low driving voltage.

On the other hand, it was confirmed that the element of Comparative Example 3 using BCP which is a compound having an ionization potential of 6.0 eV or more in the hole blocking layer (the layer disposed adjacent to the luminescent layer at the cathode side thereof) had low operating durability and showed significant reduction in the luminance. Further, the sample with only the dopant B in the luminescent layer showed two luminescence peaks derived from BAlq, thus exhibiting poor color purity.

The difference between the organic EL elements of Example 4 and of Comparative Example 3 was the difference as to whether the material contained in the hole blocking layer was BAlq having an ionization potential of 5.9 eV or BCP having an ionization potential of 6.1 eV. As shown in Table 2, it can be seen that durability was excellent in Example 4 where BAlq having an ionization potential of 5.9 eV was used. It is inferred that this is because when the ionization potential of the material contained in the hole blocking layer is higher, a larger amount of energy is required for injecting holes, and requirement of a large amount of energy for injecting holes means that the hole blocking layer is unstable with respect to the holes.

Meanwhile, when a material with low ionization potential is used for the hole blocking layer, as shown in the results for Comparative Example 4, the hole blocking layer contributes to luminescence, and the color purity is deteriorated. It is inferred that this is because when the ionization potential of the material contained in the hole blocking layer is small, injection of holes to the molecules of the hole blocking layer becomes easier.

That is, as in Example 4, when a material having an ionization potential of 6.0 eV or less is used as the material contained in a layer disposed adjacent to the luminescent layer such as the hole blocking layer, and when a constitution using phosphorescent materials of two or more kinds in the luminescent layer is employed, an element having good durability and good color purity can be obtained.

As such, from the results given in Tables 1 and 2, it was confirmed that the organic EL element of the invention exhibits the effects of the invention such as high external quantum efficiency, excellent durability and low driving voltage, by satisfying all of the following conditions: (1) containing a host material and two or more phosphorescent materials (dopants) in the luminescent layer, (2) the thickness of the layer disposed adjacent to the luminescent layer at the anode side thereof being 40 nm, and (3) containing a compound with an ionization potential of 6.0 eV or less in the layer disposed adjacent to the luminescent layer at the cathode side thereof.

According to the invention, it is possible to provide an organic electroluminescent element having high external quantum efficiency, excellent durability and low driving voltage, and a display device employing the organic electroluminescent element. Furthermore, the organic electroluminescent element of the invention has an effect of enhancing color purity, resulting from combination of two or more appropriate dopants.

What is claimed is:

1. An organic electroluminescent element comprising:
   an anode;
   a cathode; and
   a plurality of organic compound layers between the anode and the cathode, wherein the plurality of organic compound layers include a single organic luminescent layer in which a host material and dopants comprising two or more phosphorescent materials are mixed; an organic compound layer which is disposed adjacent to the organic luminescent layer at the anode side thereof and which has a thickness of 10 nm to 40 nm; and an organic compound layer which is disposed adjacent to the organic luminescent layer at the cathode side thereof and which contains a compound having an ionization potential of 6.0 eV or less.

2. The organic electroluminescent element of claim 1, wherein the spectrum resulting from electroluminescence is derived from the two or more phosphorescent materials.

3. The organic electroluminescent element of claim 2, wherein the spectrum resulting from electroluminescence is derived from one of the two or more phosphorescent materials.

4. The organic electroluminescent element of claim 1, wherein the layer disposed adjacent to the organic luminescent layer at the anode side thereof is a hole injecting layer or a hole transport layer.

5. The organic electroluminescent element of claim 4, wherein the layer disposed adjacent to the organic luminescent layer at the anode side thereof is a hole transport layer.

6. The organic electroluminescent element of claim 1, wherein the organic compound layer disposed adjacent to the organic luminescent layer at the cathode side thereof contains a compound having an ionization potential of from 5.6 to 6.0 eV.

7. The organic electroluminescent element of claim 1, wherein the layer disposed adjacent to the organic luminescent layer at the cathode side thereof is a hole blocking layer or an electron transport layer.

8. The organic electroluminescent element of claim 7, wherein the layer disposed adjacent to the organic luminescent layer at the cathode side thereof is a hole blocking layer.

9. The organic electroluminescent element of claim 1, wherein the two or more phosphorescent materials comprises two or more metal complexes.

10. The organic electroluminescent element of claim 9, wherein the two or more metal complexes comprises metal complexes having different central metals, respectively.

11. The organic electroluminescent element of claim 1, wherein the organic luminescent layer contains only two phosphorescent materials.

12. A display device comprising an array of at least two or more organic electroluminescent elements emitting light of different colors, wherein at least one of the organic electroluminescent elements is the organic electroluminescent element of claim 1.

13. The organic electroluminescent element of claim 1, wherein the organic compound layer disposed adjacent to the organic luminescent layer at the anode side thereof has a thickness of 10 nm to 25 nm.

14. An organic electroluminescent element comprising:
an anode;
a cathode; and
a plurality of organic compound layers between the anode and the cathode,
wherein the plurality of organic compound layers include one or more organic luminescent layers in each of which a host material and dopants comprising two or more phosphorescent materials are mixed; an organic compound layer which is disposed adjacent to the one or more organic luminescent layers at the anode side thereof and which has a thickness of 10 nm to 40 nm; and an organic compound layer which is disposed adjacent to the one or more organic luminescent layers at the cathode side thereof and which contains a compound having an ionization potential of 6.0 eV or less.

* * * * *